US008605523B2

(12) United States Patent
Tao et al.

(10) Patent No.: US 8,605,523 B2
(45) Date of Patent: Dec. 10, 2013

(54) TRACKING CAPACITIVE LOADS

(75) Inventors: Derek C. Tao, Fremont, CA (US);
Young Seog Kim, Pleasanton, CA (US);
Kuoyuan (Peter) Hsu, San Jose, CA
(US); Bing Wang, Palo Alto, CA (US);
Annie-Li-Keow Lum, San Jose, CA
(US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 110 days.

(21) Appl. No.: 13/399,877

(22) Filed: Feb. 17, 2012

(65) Prior Publication Data
US 2013/0215693 A1 Aug. 22, 2013

(51) Int. Cl.
*G11C 7/00* (2006.01)

(52) U.S. Cl.
USPC .......................................... 365/194; 365/149

(58) Field of Classification Search
USPC .................................................. 365/194, 149
See application file for complete search history.

(56) References Cited

U.S. PATENT DOCUMENTS 7,746,716 B2 * 6/2010 Jetton et al. ................ 365/210.1

* cited by examiner

*Primary Examiner* — Son Dinh
*Assistant Examiner* — Nam Nguyen
(74) *Attorney, Agent, or Firm* — Lowe, Hauptman & Ham, LLP

(57) ABSTRACT

A time delay is determined to cover a timing of a memory cell in a memory macro having a tracking circuit. Based on the time delay, a capacitance corresponding to the time delay is determined. A capacitor having the determined capacitance is utilized. The capacitor is coupled to a first data line of a tracking cell of the tracking circuit. A first transition of the first data line causes a first transition of a second data line of the memory cell.

20 Claims, 15 Drawing Sheets

TRACKING CAPACITIVE LOADS

FIELD

The present disclosure is related to tracking capacitive loads.

BACKGROUND

Memory cells have different read speed values. Some memory cells are "regular" or have an average read speed value. Some memory cells are faster than an average memory cell or have a read speed value lower than the average read speed value. A fast (or faster) memory cell is commonly called a strong memory cell. In contrast, some memory cells are slower than the average memory cell or have a read speed value higher than the average read speed value. A slow (or slower) memory cell is commonly called a weak memory cell. Generally, when the memory cell is accessed a strong memory cell sinks and/or sources a higher current, while a weak memory cell sinks and/or sources a lower current. As a result, the read speed of a memory cell can be identified by the current sunk and/or sourced by the memory cell.

Tracking circuits in a memory macro are used to generate tracking or reference signals based on which signals for reading memory cells are generated. Ideally, the tracking circuits cover the condition of the weakest (or "weak") memory cells to be read. Generally, weak memory cells have a longer read timing.

In an approach, the conditions of weak memory cells are simulated based on time delays of (logic) transistors manufactured by a logic manufacturing process, which is designed to manufacture transistors used in logic and/or control circuits. In contrast, a memory manufacturing process is designed to manufacture (memory) transistors used in memory devices. Speed variations of logic transistors and of memory transistors do not correlate well. For example, in a memory macro, logic transistors may be fast while memory transistors may be slow or vice versa. As a result, simulating the weak memory cell conditions based on the time delays of logic transistors, in some conditions, may not provide the desired timing.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1A:
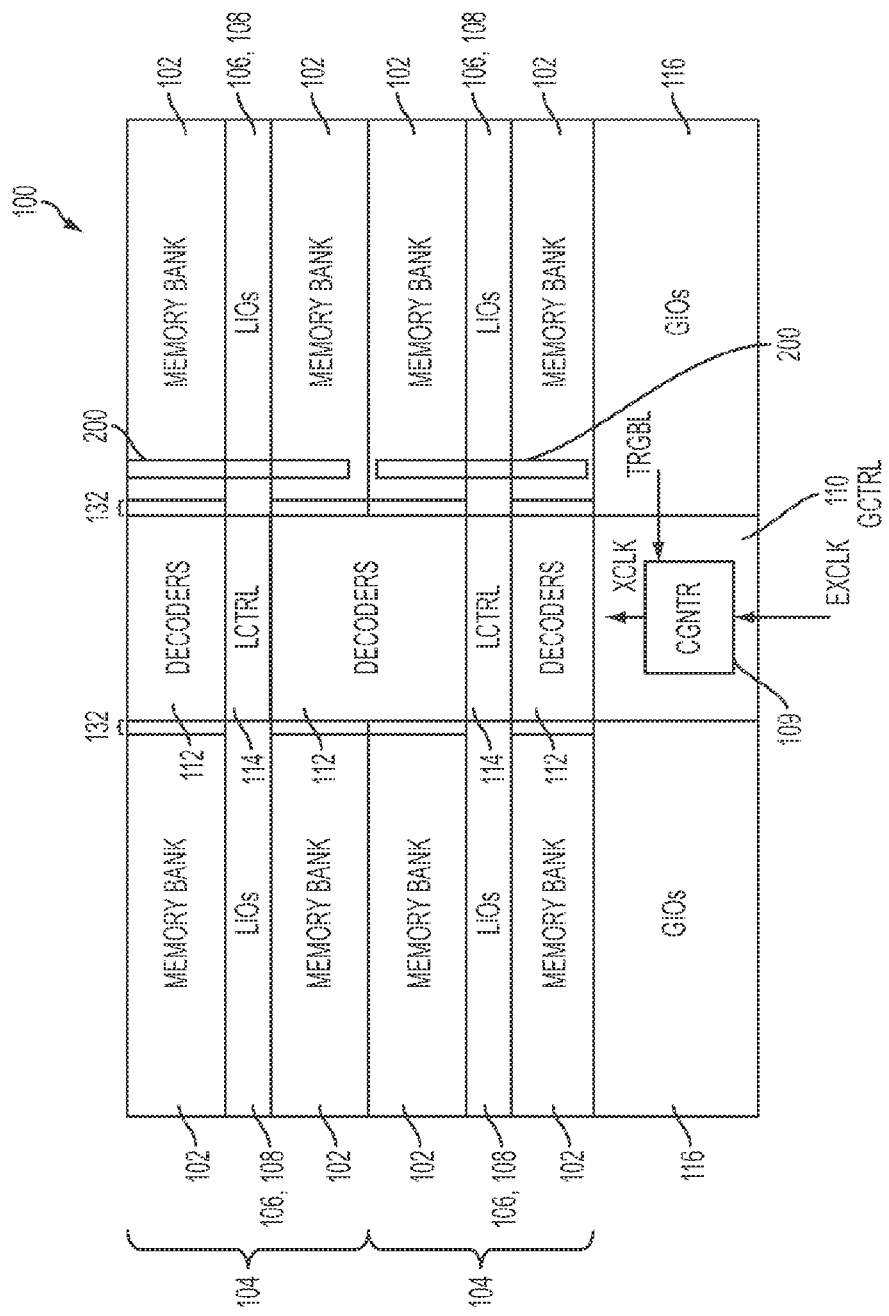
FIG. 1A is a block diagram of a memory macro, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. The weak memory cell conditions are modeled by adding capacitance loads to the tracking read bit lines of a tracking circuit. As a result, the tracking circuit covers the timing for weak bit cells at lower operational voltages, such as 70%, 80%, 85%, etc., of operational voltage VDD. Logic transistors covering the timing for weak memory cells are thus not needed. In some embodiments, the capacitance loads are achieved by metal line capacitors, MOS capacitors, diffusion, and poly capacitors. In some embodiments, the metal lines used as capacitors are from existing edge cells between the memory array and the control logic devices. As a result, the capacitance loads do not increase the layout area of the memory macro.

Memory Macro

FIG. 1A is a block diagram of a static random access memory (SRAM) macro 100, in accordance with some embodiments. In this document "rise" refers to transitioning from a low logical value to a high logical value. "Fall" refers to transitioning from a high logical value to a low logical value.

Memory macro 100 is symmetrical. For example, with reference to decoders 112, local control circuits (LCTRL) 114, and global control circuit (GCTRL) 110, circuit elements on the left side are similar to circuit elements on the right side of memory macro 100. Memory macro 100 includes a plurality of memory segments 104. Two memory segments 104 are shown for illustration. A different number of memory segments 104 is within the scope of various embodiments. Each segment 104 includes four memory banks 102, two memory banks on the left side and two memory banks on the right side. On each left side and right side of memory macro 100, two memory banks 102 share a row of a plurality of local input-output circuits (LIOs) 106 and 108. Different configurations of a memory segment are within the scope of various embodiments.

Each side of memory 100 also includes at least a tracking circuit 200. Two tracking circuits 200 are shown for illustration. Each memory bank 102 includes a plurality of memory cells 122 and a plurality of tracking cells 124 in a tracking circuit 200, which is described with reference to FIG. 2.

Address decoders 112 provide the X- or row-address of memory cells 122 to be accessed for a read or a write operation. For example, address decoders 112 determine the corresponding read word line of the accessed memory cell to be turned on based on the address of the accessed memory cell. In some embodiments, the address of the accessed memory cell is latched into global control circuit (GCTRL) 110 based on a rising edge of clock EXCLK.

Local control circuits (LCTRLs) 114 control LIOs 106 and 108, including, for example, turning on and off the read word line and the write word line of the memory cell to be read. For example, in some embodiments, based on a rising edge of a clock XCLK and the address of a memory cell to be read, a corresponding LCTRL 114 generates a rising edge of a corresponding read word line of the memory cell to be read. Similarly, based on the falling edge of clock XCLK, the corresponding LCTRL 114 generates a falling edge of the same read word line.

Global IO circuits (GIOs) 116 serve as means to transfer data between the memory cells and other circuits outside of memory macro 100.

GCTRL 110 provides the address pre-decode, clock, and other signals for memory macro 100. GCTRL 110 includes a Y-decoder (not shown) that provides the Y- or column address of a memory cell. GCTRL 110 controls the data transfer between memory cells 122 and circuits outside of memory macro 100.

Figure 3:
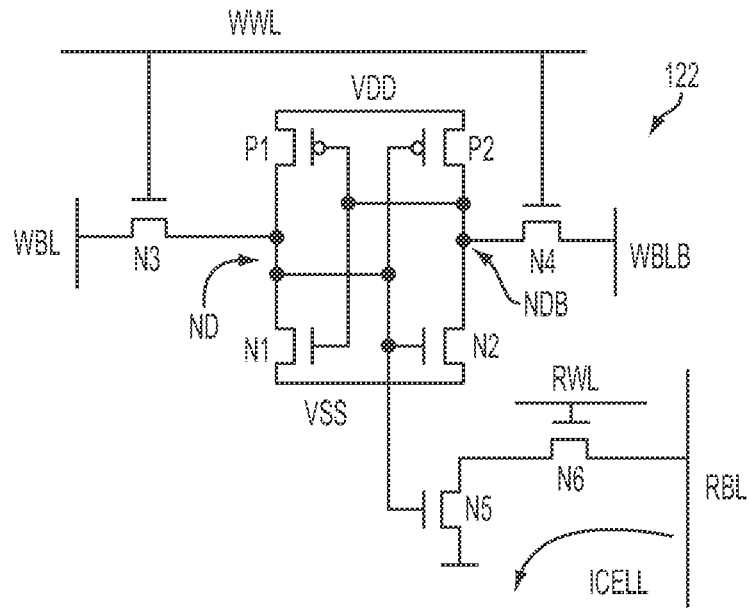
FIG. 3 is a circuit diagram of a memory cell, in accordance with some embodiments.
Figure 4:
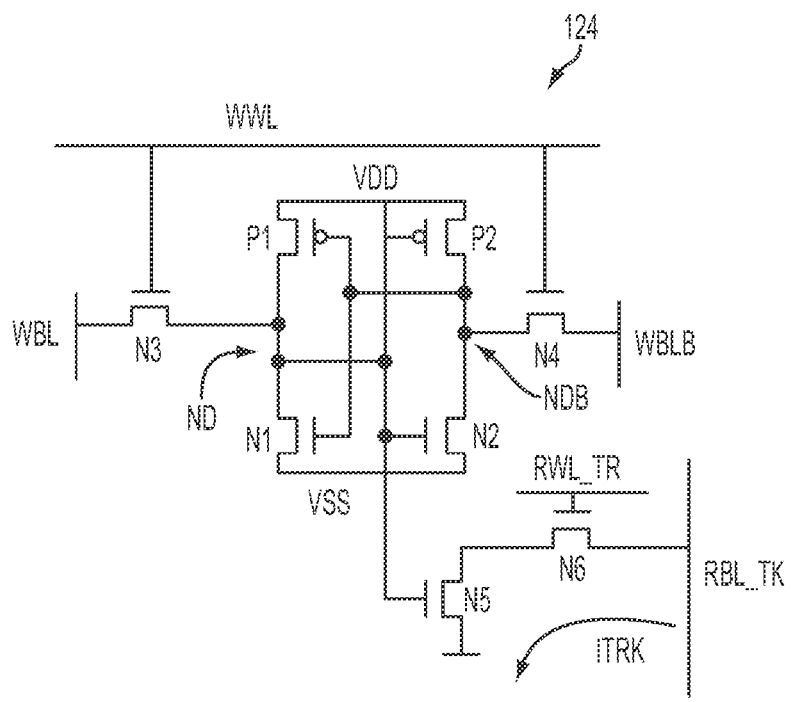
FIG. 4 is a circuit diagram of a tracking cell, in accordance with some embodiments.

Clock generator (CGNTR) 109 receives an external clock EXCLK and tracking global bit line TRGBL as inputs and generates an intermediate clock ICLK (not shown). Based on intermediate clock ICLK, clock generator 109 generates clock XCLK. Clock XCLK controls the read word line pulse widths of memory cells 122 and of tracking cells 124. Details of a memory cell 122 and a tracking cell 124 are shown in FIGS. 3 and 4, respectively.

Tracking global bit line TRGBL is generated based on clock XCLK. The transition of tracking global bit line TRGBL causes a transition in a reset signal, which is called a reset transition. In some embodiments, the reset is a low logic reset. That is, the reset transition is from a high logical value to a low logical value. A high logic reset is within the scope of various embodiments.

In some embodiments, memory circuitries include transistors and circuit components in memory banks 102 that are manufactured by a memory process. In contrast, circuitries in decoders 112 include transistors and circuit components that are manufactured by a logic process different from the memory process. Each of a column 132 on the left side and on the right side of memory macro 100 includes interface cells (not shown) used to separate memory circuitries in memory banks 102 from logic circuitries in decoders 112. Further, each of an interface cell includes a diffusion area and a metal line area above the diffusion area. The metal lines in the metal line area of the interface cells are used to form capacitors providing the capacitive load for tracking circuit 200 in FIG. 2. As a result, various embodiments are advantageous because the capacitive load for tracking circuit 200 does not require an additional layout area.

Memory Segment

Figure 1B:
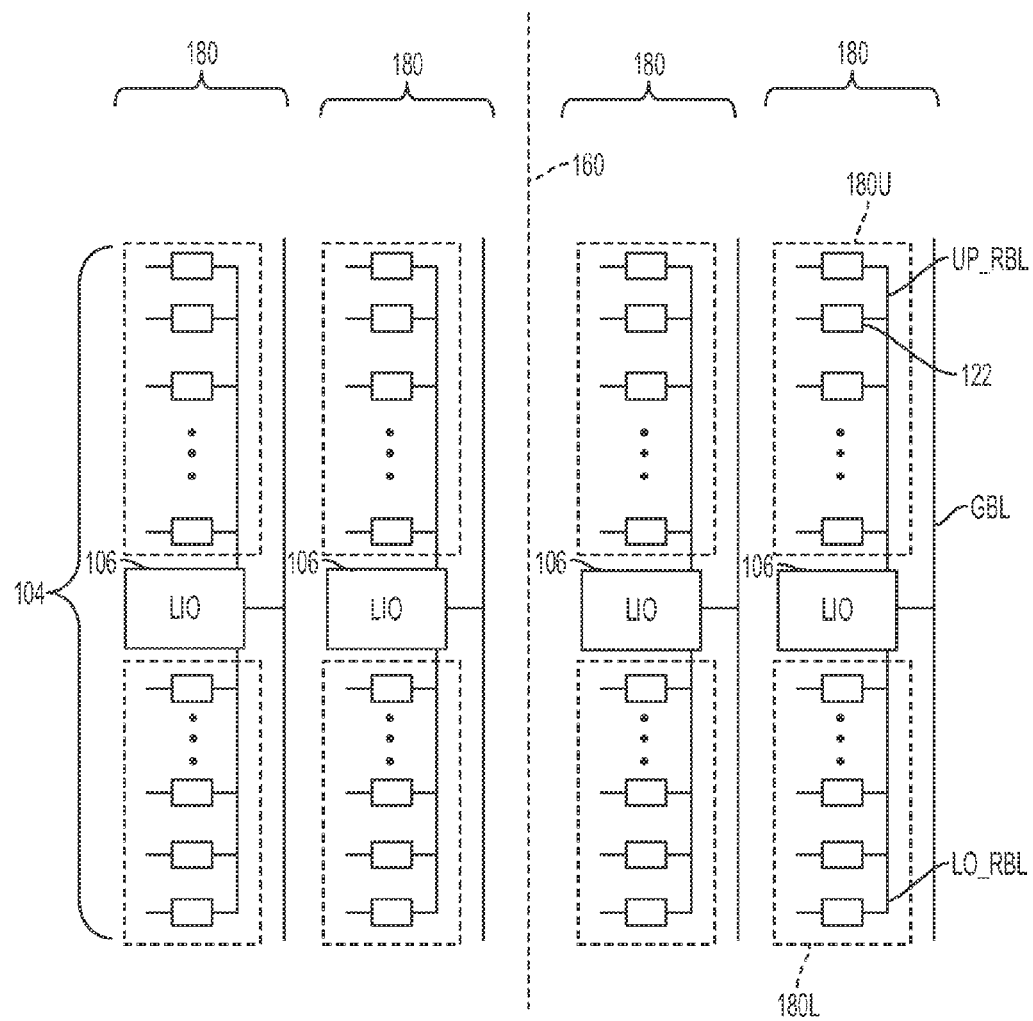
FIG. 1B is a diagram of a memory segment, in accordance with some embodiments.

FIG. 1B is a diagram of a segment 104, in accordance with some embodiments. A segment 104 includes a plurality of columns on the left side and a plurality of column of the right side of memory macro 100. For illustration, FIG. 1B shows two columns 180 on the left side and two columns 180 on the right side of dotted line 160 used as a center reference. For simplicity, only elements of one column 180 on the right side are labeled.

Each column 180 includes LIO 106 coupling an upper column 180U and a lower column 180L. An upper column 180U includes a read bit line UP_RBL coupling a plurality of first memory cells 122. For simplicity, only one memory cell 122 is labeled. Similarly, a lower column 180L includes a read bit line LO_RBL coupling a plurality of second memory cells 122. In some embodiments, the number of first memory cells 122 in an upper column 180U is the same as the number of second memory cells 122 in a lower column 180L. In some embodiments, in a read operation, one memory cell 122 in an upper column 180U or in a lower column 180L is read.

Each column 180 also includes a global bit line GBL coupled to LIO 106. The global bit line GBL couples all LIOs 106 that are on the same column direction but belong to different segments 104. Further, the number of global bit lines GBL is the same as the number of columns of memory cells in memory macro 100.

Figure 2:
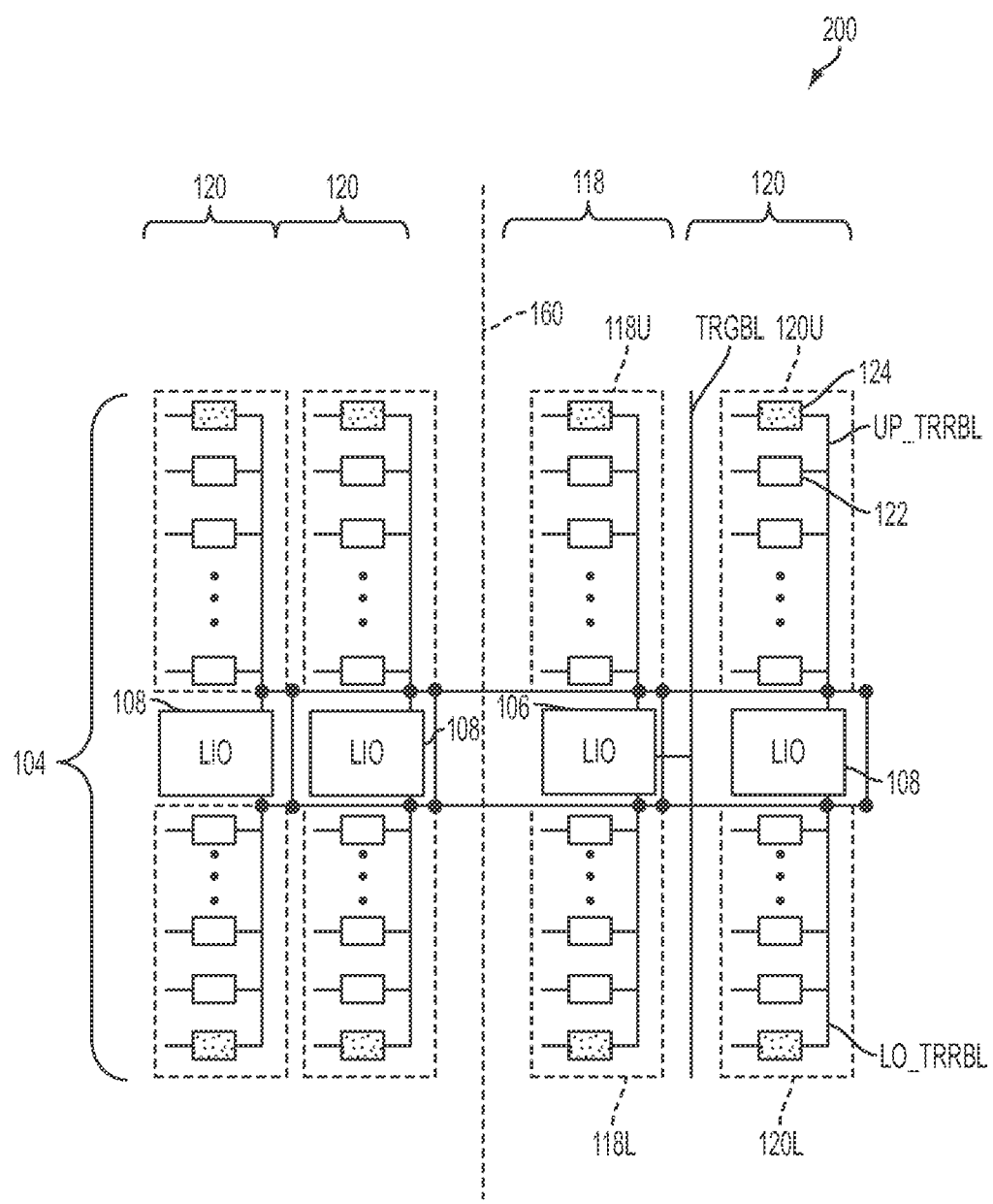
FIG. 2 is a diagram of a tracking circuit, in accordance with some embodiments.

In some embodiments, each segment 104 also includes a tracking circuit 200 detailed in FIG. 2.

Tracking Circuit

FIG. 2 is a diagram of various elements of a segment 104 illustrating a tracking circuit 200, in accordance with some embodiments.

Tracking circuit 200 includes one column 118 and three columns 120. Each column 118 and column 120 is a variation of column 180 of regular memory cells 122. Each column 120 includes one LIO 108 having a column 120U above the LIO 108 and a column 120L below the LIO 108. Each column 120U includes a plurality of memory cells 122 and one tracking cell 124 coupled to an upper tracking read bit line UP_TRRBL. Each column 120L includes a plurality of memory cells 122 and one tracking cell 124 coupled to a lower tracking read bit line LO_TRRBL. Column 118 includes one LIO 106 having a column 118U above the LIO 106 and a column 118L below the LIO 106. Column 118U includes a plurality of memory cells 122 and one tracking cell 124 coupled to an upper tracking read bit line UP_TRRBL. Column 118L includes a plurality of memory cells 122 and one tracking cell 124 coupled to a lower tracking read bit line LO_TRRBL.

For simplicity, one memory cell 122 of various memory cells 122 and one tracking cell 124 of eight tracking cells 124 are labeled. One column 120U of three columns 120U and one column 120L of three columns 120L are labeled. One upper tracking read bit line of four tracking read bit lines UP_TRRBL, and one lower tracking read bit line of four tracking read bit lines LO_TRRBL are labeled.

In some embodiments, upper tracking read bit lines UP_TRRBL and lower tracking read bit lines LO_TRRBL of all three columns 120 and of column 118 are coupled together. Upper tracking read bit lines UP_TRRBL, lower tracking read bit lines LO_TRRBL, and a tracking global bit line TRGBL are coupled to LIO 106. LIO 106 used in tracking circuit 200 is commonly called a tracking LIO. In FIG. 2, column 118 and one column 120 are on one right side of memory macro 100, and the other two columns 120 are on one left side of memory macro 100. In some embodiments, column 118 and columns 120 are selected adjacent to decoders 112 and local control circuitry LCTRL 114 in FIG. 1 to increase the speed of memory macro 100 and simplify the implementation of memory macro 100. Different locations of column 118 and/or columns 120 are within the scope of various embodiments. The relative locations of column 118 and 120 are within the scope of various embodiments. For example, two columns 120 and a pair of column 118 and column 120 may be next to one another as shown in FIG. 2, but column 118 and column 120 may be separated by one or a plurality of columns of regular memory cells 122.

Columns 120 are used to create the load for tracking circuit 200. Three columns 120 are used for illustrations, a different number of columns 120 used as a load is within the scope of various embodiments.

In some embodiments, each segment 104 corresponds to a tracking circuit 200. For example, memory macro 100 shown having two segments 104 has two tracking circuits 200. But if memory macro 100 has more than two segments 104, the number of tracking circuits 200 would correspond to the number of segments 104. Column 120 can be on the left side or on the right side of memory macro 100. In some embodiment, when memory cell 122 in one of the corresponding memory segment 104 is accessed, the corresponding tracking circuit 200 is turned on to generate tracking signals based on which read signals for the accessed memory cell 122 are generated.

In some embodiments, tracking global bit line TRGBL couples all LIOs 106 of tracking circuits 200 in a same column direction. In other words, tracking global bit line TRGBL is shared by all tracking circuits 200 of memory macro 100. As a result, tracking global bit line TRGBL is coupled to a same number of LIOs 106 as global bit line GBL.

In some embodiments, to simulate the conditions of weak bit cells 122, additional capacitance is added to tracking read bit lines of tracking circuit 200 as illustratively explained with reference to FIG. 8.

Memory Cell

FIG. 3 is a circuit diagram of a memory cell 122, in accordance with some embodiments. Memory cell 122 includes two P-type metal oxide semiconductor (PMOS) transistors P1 and P2, and six N-type metal oxide semiconductor (NMOS) transistors N1, N2, N3, N4, N5, and N6.

The gates of NMOS transistor N3 and N4 are coupled to a write word line WWL. Write word line WWL is coupled to the gates of transistors N3 and N4 of a plurality of memory cells 122 to a form a row of memory cells.

The gate of transistor N6 is coupled to a read word line RWL. Read word line RWL is coupled to each gate of transistor N6 of the plurality of memory cells 122 that are coupled to a corresponding write word line WWL.

The drain of transistor N6 is coupled to a read bit line RBL. Read bit line RBL is coupled to each drain of a plurality of transistors N6 of a plurality of memory cells 122 to form a regular column 180U, 180L, a tracking column 118U, 118L, 120U, or 120L. If memory cell 122 is in a column 180U, read bit line RBL is called UP_RBL. But if memory cell 122 is in a column 180L, read bit line RBL is called LO_RBL. Similarly, if memory cell 122 is in a column 118U or a column 120U, read bit line RBL is called upper read bit line UP_TRRBL. But if memory cell 122 is in a column 118L or a column 120L, read bit line RBL is called lower read bit line LO_TRRBL.

The drains of transistors N3 and N4 are coupled to a pair of write bit lines WBL and WBLB, respectively. Write bit lines WBL and WBLB are coupled to the drains of transistors N3 and N4 of the plurality of memory cells 122 that are coupled to the corresponding read bit line RBL.

In a write operation for memory cell 122, write word line WWL is activated. The logical values to be written to memory cell 122 are placed at write bit lines WBL and WBLB, which are then transferred to and stored at nodes ND and NDB at the sources of transistors N3 and N4, respectively.

In a read operation, read word line RWL is activated to turn on transistor N6. Detecting the voltage value at read bit line RBL reveals the data stored in nodes NDB and ND. In some embodiments, the read data reflected on read bit line RBL is then transferred through LIO 106 to global bit line GBL, GIOs circuit 116, and circuits outside of memory macro 100.

In some embodiments, prior to transistor N6 being turned on, read bit line RBL is charged to a high logical value. When transistor N6 is turned on, memory cell 122 sinks a current ICELL that flows at read bit line RBL or the drain of transistor N6 to the source of transistor N5 or ground. In effect, read bit line RBL is pulled from a high logical value to a low logical value. If memory cell 122 is a strong memory cell, current ICELL is large and read bit line RBL is pulled to ground faster. But if memory cell 122 is weak, current ICELL is small and read bit line RBL is pulled to ground slower.

Tracking Cell

FIG. 4 is circuit diagram of a tracking cell 124, in accordance with some embodiments.

Tracking cell 124 includes circuit components similar to those of memory cell 122. Tracking read word line RWL_TK and tracking read bit line RBL_TK correspond to read word line RWL and read bit line RBL of memory cell 122, respectively. The gates of transistors P2, N2, and N5 in tracking cell 124 are configured to receive operational voltage VDD. As a result, PMOS transistor P2 is always off while NMOS transistors N2 and N5 are always on when voltage VDD is provided. Similar to memory cell 122, if track memory cell 124 is in a column 118U or a column 120U, read bit line RBL_TK is called upper read bit line UP_TRRBL. But if tracking cell 124 is in a column 118L or a column 120L, read bit line RBL_TK is called lower read bit line LO_TRRBL.

In some embodiments, when tracking read word line RWL_TK is activated, transistor N6 of tracking cell 124 is turned on. Transistors N5 and N6 sink current ITRK at the drain of transistor N6 to the source of transistor N5. A strong tracking cell 124 has a larger current ITRK while a weak tracking cell 124 has a smaller current ITRK.

LIOs

Figure 5:
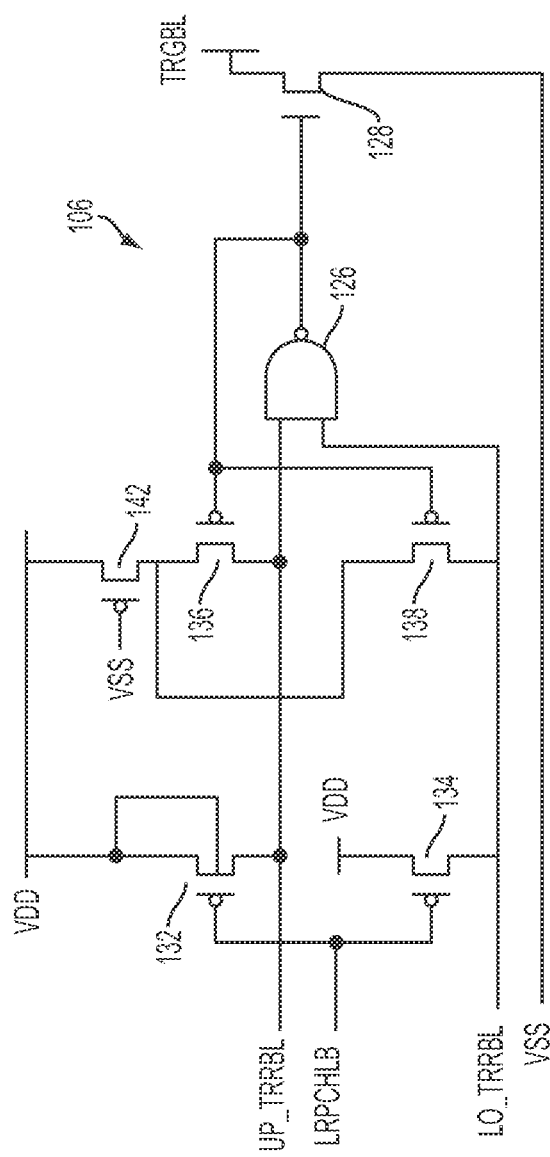
FIG. 5 is a circuit diagram of a local input-output circuit (IO) circuit, in accordance with some embodiments.

FIG. 5 is a circuit diagram of LIO 106, in accordance with some embodiments. LIO 106 is used in both a regular column 180 in FIG. 1B and a tracking column 118 in FIG. 2. LIO used in a tracking column 118 is commonly called a tracking LIO. In a regular column 180, upper tracking read bit line UP_TRRBL and lower tracking read bit line LO_TRRBL are called upper read bit line UP_RBL and lower read bit line LO_RBL, respectively. Further, tracking global bit line TRGBL is called global bit line GBL. For illustration, LIO 106 in FIG. 5 is explained in the context of a tracking column 118. Operation of LIO 106 in the context of a regular column 180 is similar and should be recognizable by persons of ordinary skill in the art.

Each input of NAND gate 126 is coupled to an upper tracking read bit line UP_TRRBL and a lower tracking read bit line LO_TRRBL. In some embodiments as illustrated in FIG. 2, upper read bit line UP_TRRBL and lower read bit line LO_TRRBL are coupled together. The output of NAND gate 126 controls the gate of transistor 128, and, effectively, controls tracking global bit line TRGBL at the drain of transistor 128. Transistors 132, 134, 136, and 138 provide appropriate voltage values to the inputs of NAND gate 126, based on control signal LRPCHLB, operational voltage VDD, and reference voltage VSS.

Figure 6:
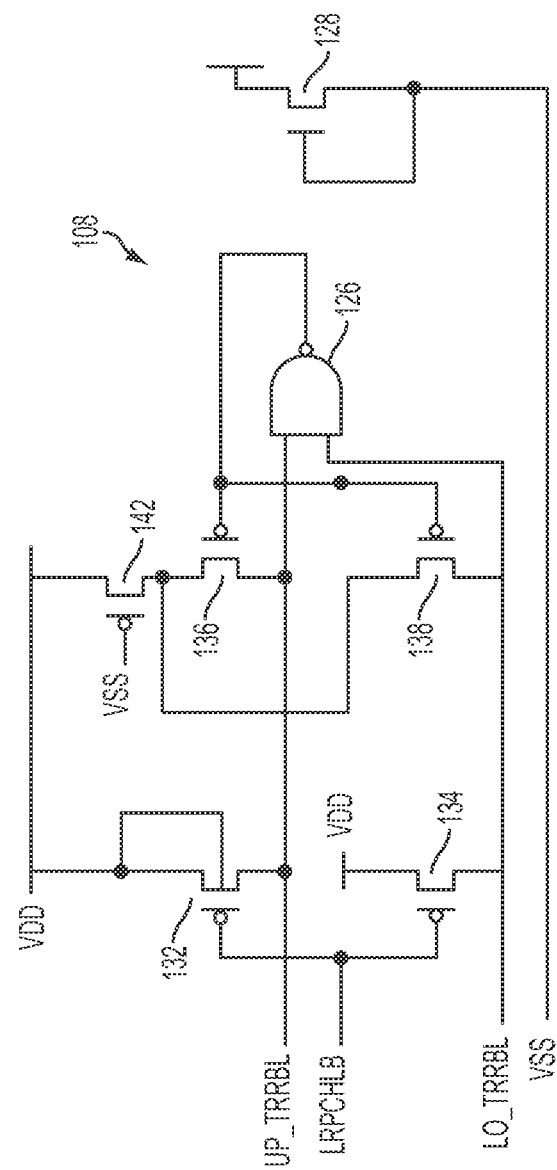
FIG. 6 is a circuit diagram of a tracking IO circuit, in accordance with some embodiments.

FIG. 6 is a circuit diagram of LIO 108, in accordance with some embodiments. LIO 108 includes circuit components similar to those of LIO 106 in FIG. 5. The output of NAND gate 126 in LIO 108, however, is not coupled to the gate of transistor 128. In contrast, the gate of transistor 128 is coupled to the source of transistor 128 or voltage VSS. As a result, transistor 128 is always off and acts as an open circuit.

Tracking Path

Figure 7A:
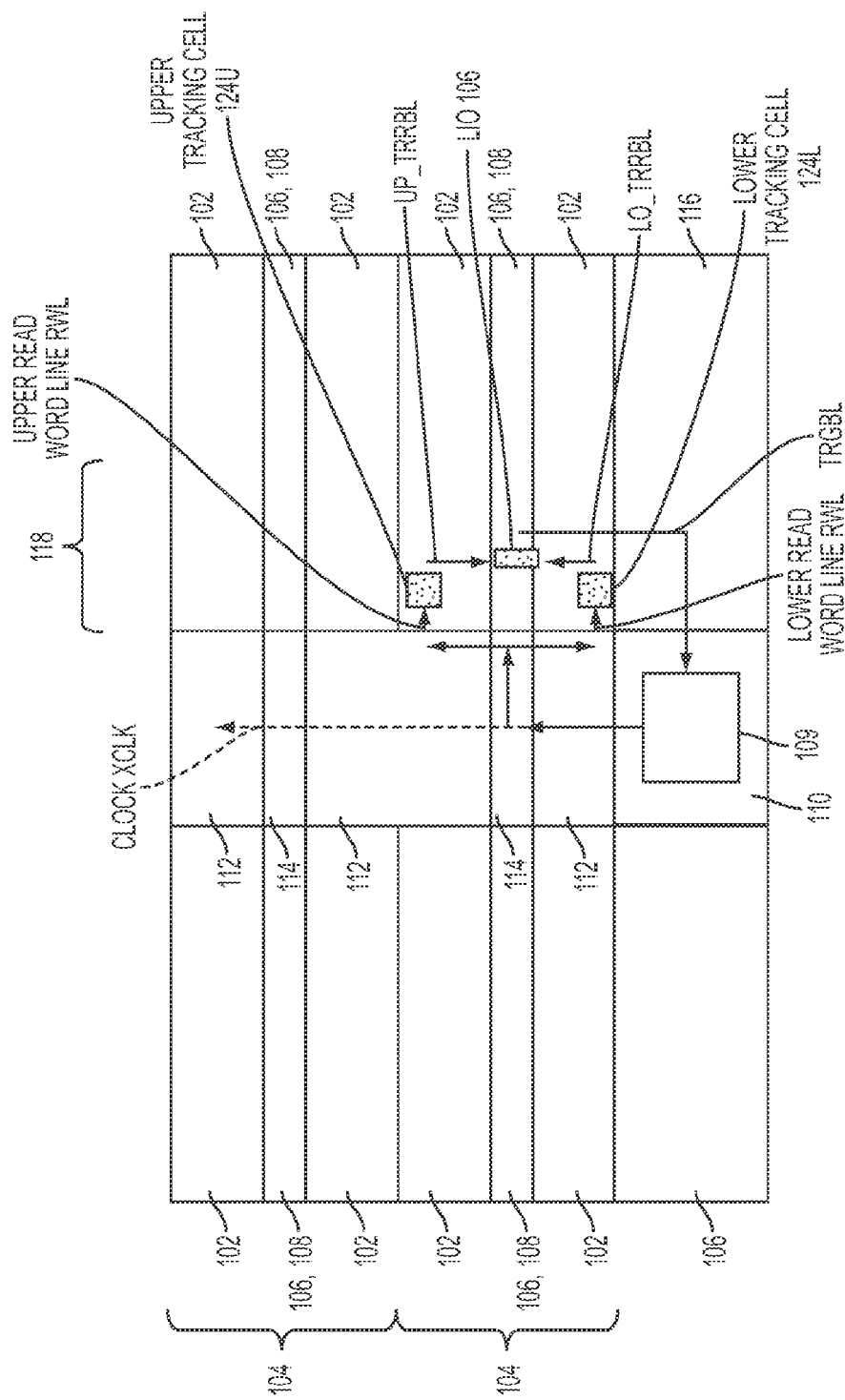
FIG. 7A is a diagram of a macro memory used to illustrate a tracking path, in accordance with some embodiments.

FIG. 7A is a block diagram of memory macro 100 used to illustrate a tracking path, in accordance with some embodiments. FIG. 7 shows an example of a tracking path of a circuit 200 for memory segment 104. The tracking path of another tracking circuit 200 for another segment 104 of memory macro 100 is similar and should be recognizable by persons of ordinary skill in the art in view of this document. In some embodiments, reading memory cell 122 in the corresponding segment 104 triggers the corresponding tracking circuit 200 and the tracking path as illustratively shown in FIG. 7A.

In some embodiments, tracking global bit line TRGBL transitions from a high logical value to a low logical value. The transition of tracking global bit line TRGBL is caused by an operation of tracking circuit 200 that includes one column 118 and three columns 120 illustratively shown in FIG. 2. For simplicity, some elements of column 118 in FIG. 2 are shown FIG. 7A, but three columns 120 in FIG. 2 are not shown in FIG. 7A. Effectively, the transition of tracking global bit line TRGBL is caused by the operations of an upper tracking cell 124 and a lower tracking cell 124 illustratively shown in FIG. 4. As a result, tracking read bit line RBL_TK of the upper tracking cell 124 and of the lower tracking cell 124 correspond to upper read tracking bit line UP_TRRBL and lower read tracking bit line LO_TRRBL of column 118U and column 118L, respectively. The transition of tracking global bit line TRGBL is also caused by the operations of LIO 106 coupled to upper read tracking bit line UP_TRRBL and lower read tracking bit line LO_TRRBL. The detail of LIO 106 is illustratively described with reference to FIG. 5. In some embodiments, upper tracking read bit line UP_TRRBL, lower tracking read lit line LO_TRRBL, and tracking global bit line TRGBL are initially pre-charged to a high logical value.

In some embodiments, a rising edge of clock EXCLK causes clock XCLK to rise. Once the rising edge of clock XCLK is generated, clock XCLK is then transmitted from clock generator 109 through one or various decoders 112 and local control circuit LCTRL 114 to a corresponding segment 104 that includes memory cell 122 to be read. Based on the rising edge of clock XCLK, LCTRL 114 corresponding to the memory cell 122 to be read causes a corresponding read word line RWL of the memory cell 122 to rise. The data at node ND or the gate of transistor N5 of memory cell 122 to be read is reflected on the corresponding read bit line RBL. Through a corresponding local LIO 106 coupling the read bit line RBL and global bit line GBL, the data to be read is transferred from read bit line RBL to the corresponding global bit line GBL, which is then transferred to global IO circuit 116, and to other circuits outside of memory macro 100.

The rising edge of clock XCLK is also transmitted to a corresponding tracking circuit 200 of a corresponding segment 104 that includes the memory cell 122 to be read. Clock XCLK is then used to activate the upper tracking read word line RWL_TK (shown in FIG. 4) and the lower tracking read word line RWL_TK of the respective upper tracking cell 124 and the lower tracking cell 124 of tracking circuit 200. For example, in some embodiments, a high logical value of clock XCLK causes transistors N6 of upper tracking cell 124 and of lower tracking cell 124 to turn on. Upper tracking read bit line UP_TRRBL and lower tracking read bit line LO_TRRBL are pulled to ground or a low logical value at the source of transistors N5 of upper tracking cell 124 and of lower tracking cell 124. NAND gate 126 of LIO 106 illustrated in FIG. 5 receives a low logical value of upper tracking read bit line UP_TRRBL and of lower tracking read bit line LO_TRRBL at both inputs. As a result, output of NAND gate 126 at the gate of transistor 128 has a high logical value, which turns on NMOS transistor 128. Because transistor 128 is turned on, tracking global bit line TRGBL is pulled to reference voltage VSS or a low logical value at the source of transistor 128. Effectively, tracking global bit line TRGBL transitions from a high logical value to a low logical value. In some embodiments, tracking global bit line TRGBL is fed to clock generator 109, and causes a tracking reset signal TRRSET (not shown) to also transition from a high to a low logical value. In this document, a reference to the high to low transition of tracking global bit line TRGBL also refers to the high to low transition of tracking reset signal TRRSET.

In some embodiments, the falling edge of tracking global bit line TRGBL causes clock ICLK to rise and clock XCLK to fall. The falling edge of clock XCLK then travels through one or a plurality of decoders 112 and local control circuits LCTRL 114 to the segment 104 having the memory cell 122 to be read. A corresponding LCTRL 114, based on the falling edge of clock XCLK, causes the falling edge of the corresponding read word line RWL of the memory cell to be read. The LCTRL 114 also causes the rising edge of the corresponding read bit line RBL.

Waveforms for Tracking Signals

Figure 7B:
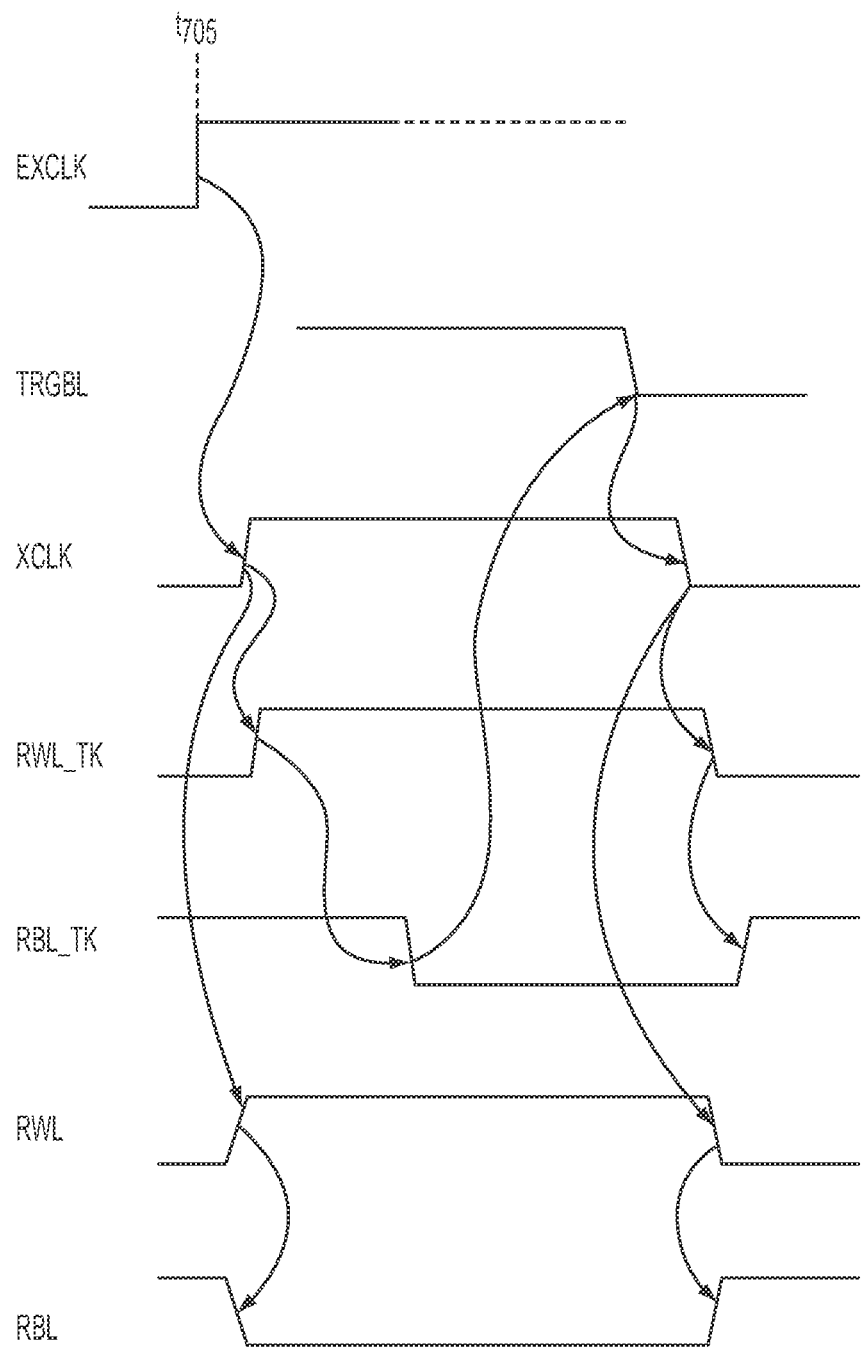
FIG. 7B is a graph of waveforms illustrating the relationships of various signals, in accordance with some embodiments.

FIG. 7B is a graph of waveforms illustrating the relationships of various signals, in accordance with some embodiments.

At time t705, a rising edge of clock EXCLK causes clock XLCK to rise.

The rising edge of clock XCLK causes the tracking read word lines RWL_TK of tracking cells 124 of tracking circuit 200 and the read word line RWL of the memory cell 122 to be read to rise.

The rising edge of read word line RWL of the memory cell 122 to be read causes read bit line RBL of the memory cell 122 to be read to fall.

The rising edge of tracking read word lines RWL_TK causes tracking read bit lines RBL_TK of tracking cells 124 of tracking circuit 200 to fall.

The falling edge of tracking read bit lines RBL_TK causes tracking global bit line TRGBL to fall.

The falling edge of tracking global bit line TRGBL causes clock XCLK to fall.

The falling edge of clock XCLK causes tracking read word lines RWL_TK of tracking cells 124 of tracking circuit 200 and read word line RWL of the memory cell 122 to be read to fall.

The falling edge of tracking read word lines RWL_TK causes tracking read bit lines RBL_TK to rise.

The falling edge of read word line RWL of the memory cell 122 to be read causes read bit line RBL of the memory cell 122 to be read to rise.

Capacitive Load on Tracking Read Bit Lines

Figure 8A:
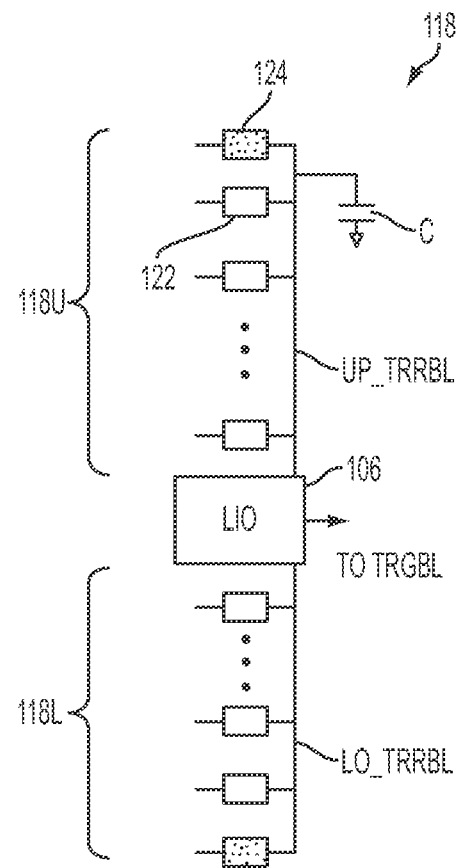
FIG. 8A is diagram of a column in a tracking circuit, in accordance with some embodiments.

FIG. 8A is a diagram of column 118 in FIG. 2, in accordance with some embodiments. Column 118 in FIG. 8A also includes a capacitor C coupled to tracking read bit line UP_TRRBL. Capacitor C has capacitance Cadd (not labeled).

In some embodiments, upper tracking read bit lines UP_TRRBL and lower tracking read bit lines LO_TRRBL in tracking circuit 200 are coupled together. As a result, in some embodiments, capacitor C causes an additional delay when upper tracking read bit lines UP_TRRBL and lower tracking read bit lines LO_TRRBL fall or transition from a high logical value to a low logical value. For simplicity, the following discussion refers to tracking read bit line TRRBL to cover both upper tracking read bit line UP_TRRBL and lower tracking read bit line LO_TRRBL.

For example, in some embodiments, when tracking circuit 200 (FIG. 2) is invoked, tracking read bit line TRRBL is pre-charged to a high logical value. When tracking read word line RWL_TR of tracking cell 124 is activated, transistor N6 of tracking cell 124 is turned on. Transistors N5 and N6 of tracking cell 124 pull tracking read bit line TRRBL to the low logical value or ground at the source of transistor N5. Capacitor C, however, causes tracking read bit line TRRBL to fall at a slower rate. Effectively, the falling edge of tracking read bit line TRRBL, which corresponds to tracking read bit line RBL_TK in FIG. 7B, is delayed. As a result, the falling edge of tracking global bit line TRGBL, the falling edge of clock XCLK, and the falling edge of read word line RWL of the memory cell to be read as shown in FIG. 7B are delayed. In other words, tracking circuit 200 covers the slow timing of weak bit cells 122.

Figure 8B:
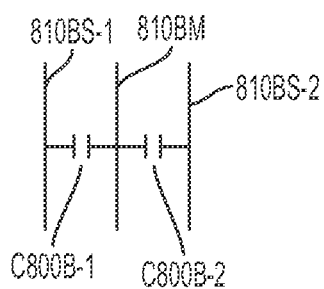
FIGS. 8B-8G are diagrams of capacitors implemented as capacitive loads, in accordance with some embodiments.

FIG. 8B is a diagram of capacitors C800B-1 and C800B-2 implemented as capacitor C in FIG. 8A, in accordance with some embodiments. Capacitor C800B-1 is formed by a first reference voltage VSS line 810BS-1 and a metal line 810BM. Capacitor C800B-2 is formed by a second VSS line 810BS-2 and metal line 810BM. Capacitance Cadd of capacitor C is the total capacitance of capacitor C800B-1 and of capacitor C800B-2.

Figure 8C:
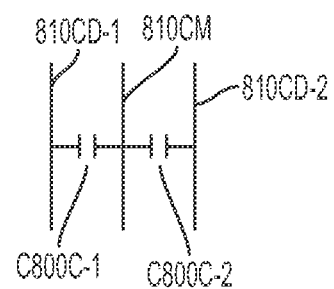

FIG. 8C is a diagram of capacitors C800C-1 and C800C-2 implemented as capacitor C in FIG. 8A, in accordance with some embodiments. Capacitor C800C-1 is formed by a first operational voltage VDD line 810CD-1 and a metal line 810CM. Capacitor C800C-2 is formed by a second VDD line 810CD-2 and metal line 810CM. Capacitance Cadd of capacitor C is the total capacitance of capacitor C800C-1 and of capacitor C800C-2.

Figure 8D:
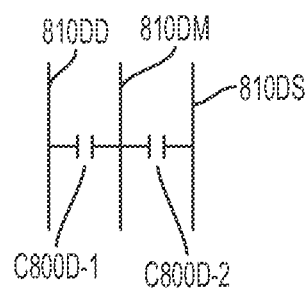

FIG. 8D is a diagram of capacitors C800D-1 and C800D-2 implemented as capacitor C in FIG. 8A, in accordance with some embodiments. Capacitor C800D-1 is formed by an operational voltage VDD line 810DD and a metal line 810DM. Capacitor C800D-2 is formed by a reference voltage VSS line 810DS and metal line 810DM. Capacitance Cadd of capacitor C is the total capacitance of capacitor C800D-1 and of capacitor C800D-2.

In each of FIGS. 8B, 8C, and 8D, a pair of capacitors is shown for illustration. A single capacitor of the pair of capacitors implemented as capacitor C is within the scope of various embodiments.

In some embodiments, each metal line to form lines 810BS-1, 810BS-2, 810BM, 810CD-1, 810CD-2, 810CM, 810DD, 810DS, and 810DM is the same type of the metal line used as a read bit line or as a tracking read bit line. Further, the pair of metal lines forming a corresponding capacitor has a known capacitance value per length unit of about 0.4 femtofarads per micro meter (ff/μm). Capacitance Cadd of capacitor C is thus proportional to the length of the metal lines used as capacitor C. After the capacitance value corresponding to a desired delay in the falling edge of tracking read bit line TRRBL is calculated, a corresponding capacitor is formed by the corresponding pair of metal lines. The corresponding metal line 810BM, 810CM, and/or 810DM is coupled to tracking read bit line TRRBL. In some embodiments, because tracking read bit lines UP_TRRBL and LO_TRRBL of tracking circuit 200 are coupled together, capacitor C is coupled to any one of tracking read bit lines UP_TRRBL or LO_TRRBL of column 118 or column 120 of tracking circuit 200.

In some embodiments, capacitor C includes a plurality of capacitors corresponding to a plurality of pairs of metal lines. Each of a tracking read bit line UP_TRRBL and LO_TRRBL is coupled to a corresponding metal line capacitor, and the total capacitance of the metal line capacitors equals capacitance Cadd of capacitor C. Embodiments of the disclosure are not limited to the number of capacitors used as capacitor C and/or the location of each metal line capacitor.

In some embodiments, the metal lines of the interface cells of column 132 in FIG. 1A are available for use as the metal lines 810BS-1, 810BS-2, 810BM, 810CD-1, 810CD-2, 810CM, 810DD, 810DS, and 810DM to form the corresponding metal line capacitors as illustratively shown in FIGS. 8B, 8C, and 8D. As a result, no additional layout space is occupied by capacitor C.

Figure 8E:
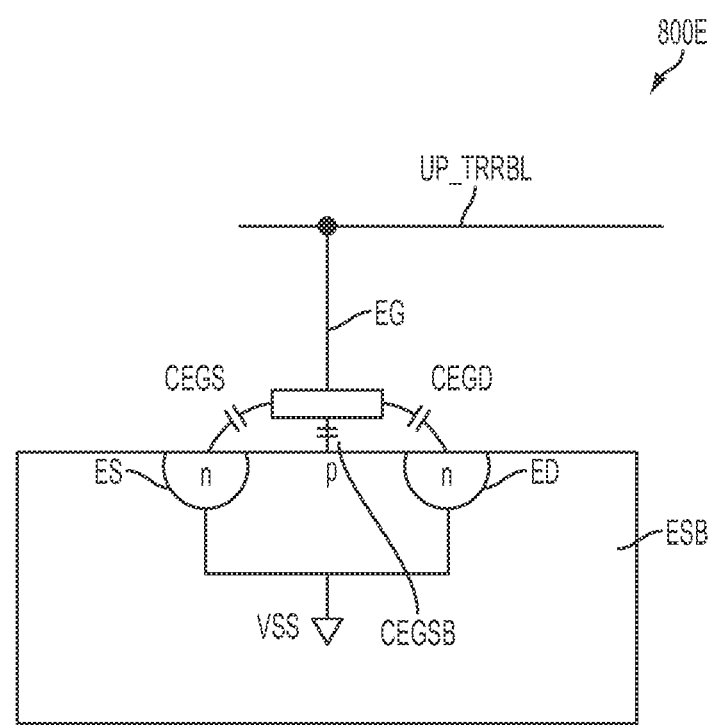

FIG. 8E is a diagram of a metal oxide semiconductor capacitor (MOS CAP) 800E implemented as capacitor C, in accordance with some embodiments. MOS CAP 800E is formed by a transistor having a source ES, a drain ED, a gate EG, and a substrate ESB. The source ES and the drain ED are coupled together and to reference voltage VSS. The gate EG is coupled to a tracking read bit line of tracking circuit 200, such as upper tracking read bit line UP_TRRBL illustratively shown in FIG. 8A. The total capacitance of MOS CAP 800E includes the capacitance of a capacitor CEGS between the gate EG and the source ES, a capacitor CEGD between the gate EG and the drain ED, and a capacitor CEGSB between the gate EG and the substrate ESB. In some embodiments, the source ES and the drain ED are of an N dopant type while the substrate ESB is of a P dopant type. Other dopant types are within the scope of various embodiments. In some embodiments, the transistor forming MOS cap 800E is either manufactured by a memory process or a logic process. The memory process is used to manufacture transistors in memory cells 122.

Figure 8F:
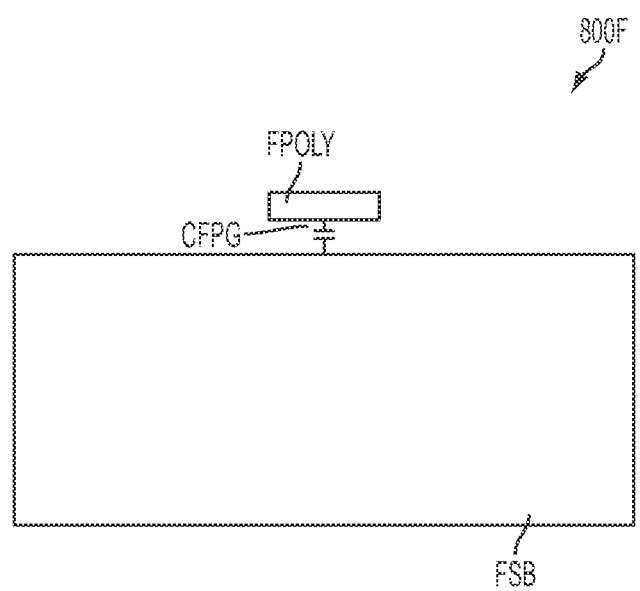

FIG. 8F is a diagram of a diffusion capacitor 800F implemented as capacitor C, in accordance with some embodiments. Capacitor CFPG is formed by the poly region FPOLY of a gate of a transistor and a substrate FSB of the same transistor. In some embodiments, the poly region FPOLY includes polysilicon or poly while the substrate FSB is doped with either a P-dopant type or an N-type dopant. Other materials and dopant types are within the scope of various embodiments. The capacitance of capacitor CFPG is the same as that of capacitor 800F.

Figure 8G:
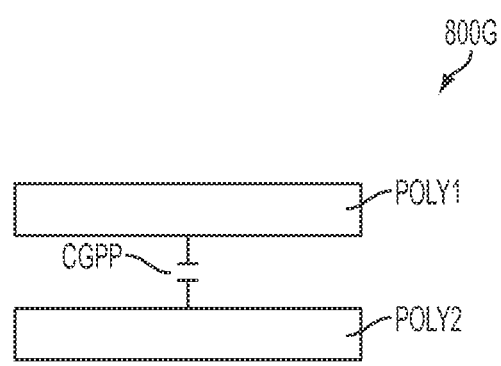

FIG. 8G is a diagram of a poly capacitor 800G implemented as capacitor C, in accordance with some embodiments. Capacitor CGPP is formed by a first poly region POLY1 and a second poly region POLY2 of a transistor (not shown) having at least two gates. The capacitance of capacitor CGPP is the same as that of capacitor 800G.

Other ways of implementing capacitor C to function as a capacitive load for tracking circuit 200 are within the scope of various embodiments.

Tracking Current and Current of Weak Cells

In some embodiments, at a particular operational voltage value VDD, the average current ITRACKING (not labeled) of all tracking cells 124 in a tracking circuit 200 in FIG. 2 is calculated. For example, current ITOTAL (not labeled) sunk by all tracking cells 124 in circuit 200 is determined. Current ITOTAL is the sum of each current ITRK in FIG. 4 that is sunk by each tracking cell 124 in circuit 200. In some embodiments, current ITOTAL is determined by a circuit simulation. Current ITRACKING is then obtained by dividing current ITOTAL by the number of tracking cells 124 in tracking circuit 200. In some embodiments, current ITRACKING corresponds to the average current ICELL of memory cells 122 in memory macro 100.

In some embodiments, a current IWEAK (not labeled) of the weakest cell of all memory cells 122 in memory macro 100 is determined at a particular voltage value VDD. In some embodiments, current IWEAK is determined based on the 6-sigma value of a plurality of values of current ICELL in FIG. 3 of memory cells 122. For example, a model simulation is performed to determine the values of current ICELL of all memory cells 122 in memory macro 100. Based on the values of current ICELL, the 6-sigma value is calculated and considered as the value for current IWEAK. The 6-sigma value calculation is not described, but should be recognizable by persons of ordinary skill in the art.

Different ways of determining the value for current IWEAK are within the scope of various embodiments. For example, in some embodiments, the 6-sigma value in addition to the values of current ICELL of memory cells 122 in FIG. 3 includes the values of current ITRK of tracking cells 124 in FIG. 4. For another example, in some embodiments, a different sigma value, such as the 5-sigma, 4-sigma, 3-sigma, 2-sigma, etc., is used instead of the 6-sigma value.

Waveforms for Capacitive Load

Figure 9:
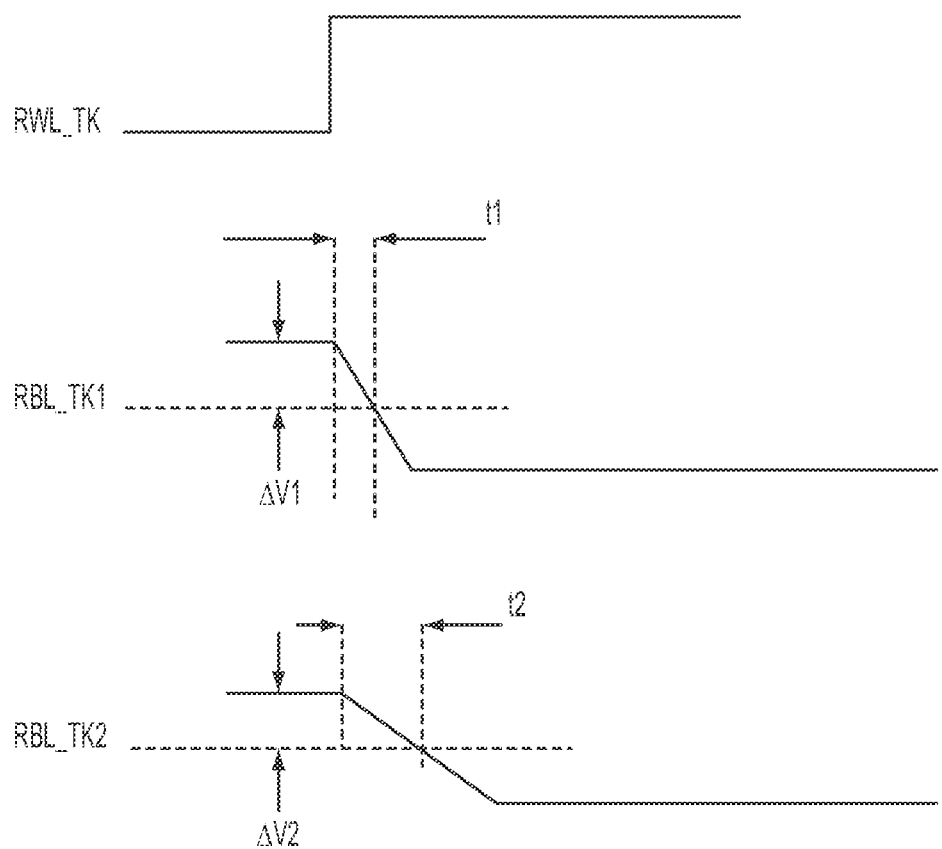
FIG. 9 is a graph of waveforms used to illustrate how capacitance of the capacitive load is calculated, in accordance with some embodiments.

FIG. 9 is a graph of waveforms used to illustrate how capacitance Cadd of capacitor C is calculated.

Tracking read word line RWL_TK is shown to indicate that the rising edge of tracking read word line RWL_TK causes the falling edge of tracking read bit line RBL_TK.

Waveform RBL_TK1 represents tracking read bit line RBL_TK without capacitor C in tracking circuit 200. $\Delta V1$ is the voltage dropped from a high logical value of waveform RBL_TK1 to the trip point of waveform RBL_TK1. Time t1 is the time it takes for waveform RBL_TK1 to drop a voltage $\Delta V1$ from the high logical value of waveform RBL_TK1. In some embodiments, simulation is performed to generate waveform RBL_TK1, and time t1 is acquired based on the high logic value and the trip point of waveform RBL_TK1. In some embodiments, the high logic value of waveform RBL_TK1 is operational voltage VDD, and the trip point of waveform RBL_TK1 is ½ VDD.

Waveform RBL_TK2 represents tracking read bit line RBL_TK with capacitor C in tracking circuit 200. $\Delta V2$ is the voltage dropped from a high logical value of tracking read bit line RBL_TK2 to the trip point of waveform RBL_TK2. Time t2 is the time it takes for waveform RBL_TK2 to drop a voltage value $\Delta V2$ from the high logical value of waveform RBL_TK1. In some embodiments, simulation is performed to generate waveform RBL_TK2, and time t2 is acquired based on the high logic value and the trip point of waveform RBL_TK2. In some embodiments, the high logic value of waveform RBL_TK2 is operational voltage VDD, and the trip point of waveform RBL_TK2 is ½ VDD.

In some embodiments, voltage $\Delta V1$ equals to voltage $\Delta V2$. For illustration, $\Delta V$ is used to refer to either $\Delta V1$ or $\Delta V2$. Further, $\Delta t$ is the difference between t2 and t1, and is the delay of tracking read bit line RBL_TK caused by the additional capacitor C coupled to the tracking read bit line RBL_TK of tracking circuit 200. Effectively, $\Delta t$ is the desired time delay calculated to cover the weak (or weakest) memory cell in memory macro 100.

C1 is the total capacitance of four tracking bit lines UP_TRRBL and of four tracking bit lines LO_TRRBL in tracking circuit 200 of FIG. 2, without capacitor C. C2 is the total capacitance of capacitor C1 and of capacitor C.

Mathematically Expressed:

$$Cadd = C2 - C1 \qquad (1)$$

$$\Delta t = t2 - t1 \qquad (2)$$

$$t1 = (C1 * \Delta V1)/IWEAK \qquad (3)$$

$$t2 = (C2 * \Delta V2)/ITRK \qquad (4)$$

Based on the above equations (1), (2), (3), and (4), capacitance Cadd of capacitor C is determined. Based on capacitance Cadd, the corresponding capacitor used to implement capacitor C is formed. For example, if the metal lines illustratively shown in FIGS. 8B to 8D are used, the length of each metal line is determined to provide capacitance Cadd of capacitor C. If the MOSCAP in FIG. 8E is used, the total capacitance of capacitors CEGS, CEGD, and CEGSB is determined to provide capacitance Cadd. If the diffusion capacitor in FIG. 8F is used, the capacitance of capacitor CFPG is determined as capacitance Cadd. Similarly, if the poly capacitor in FIG. 8G is used, the capacitance of capacitor CGFPP is determined as capacitance Cadd, etc.

Method for Determining the Capacitive Load

Figure 10:
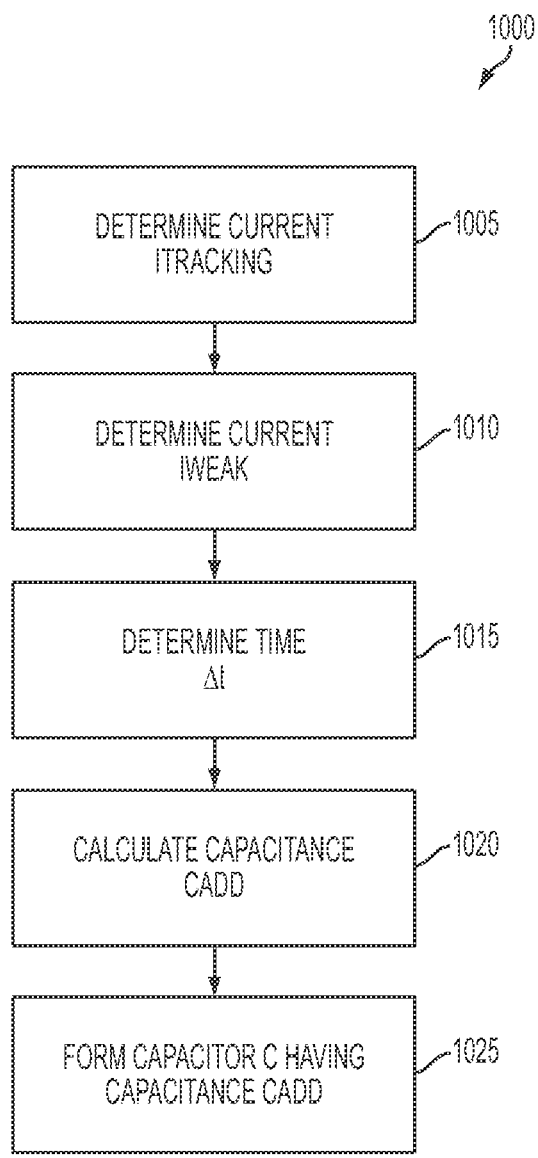
FIG. 10 is a flowchart of a method illustrating how capacitance of a capacitive load is calculated, in accordance with some embodiments.

FIG. 10 is a flowchart of a method 1000 illustrating how capacitance Cadd is calculated. In this illustration, the minimum operational voltage VDD is used because, in some embodiments, the memory cells 122 and tracking cells 124 are weakest at the minimum operational voltage VDD. Further, the minimum operational voltage VDD is about 80% of nominal operational voltage VDD.

In step 1005, current ITRACKING is determined. For example, current ITRACKING is calculated as illustratively explained.

In step 1010, current IWEAK is determined. For example, current IWEAK is determined as illustratively explained.

In step 1015, delay time $\Delta t$ is determined. For example, delay time $\Delta t$ is determined based on time t1 and time t2 as illustratively shown in FIG. 9.

In step 1020, capacitance Cadd is calculated based on equations (1), (2), (3), and (4).

In step 1025, depending on the type of capacitors implemented as capacitor C, capacitor C is formed to provide the corresponding capacitance Cadd.

Various embodiments are advantageous because capacitor C simulates the conditions for the weak (or weakest) bit cells. As a result, logic devices that simulate the conditions for weak bit cells are no longer needed. Capacitor C covers the reading time for the weak bit cells. As a result, memory macro 100 can operate at lower operational voltage VDD. In other words, the minimum voltage for operational voltage VDD is lowered, and the operational voltage range is increased.

A number of embodiments have been described. It will nevertheless be understood that various modifications may be made without departing from the spirit and scope of the disclosure. For example, the various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logical value of various signals used in the above description is also for illustration purposes. Various embodiments are not limited to a particular value when a signal is activated and/or deactivated. Selecting different values is within the scope of various embodiments.

In some embodiment, a time delay is determined to cover a timing of a memory cell in a memory macro having a tracking circuit. Based on the time delay, a capacitance corresponding to the time delay is determined. A capacitor having the determined capacitance is utilized. The capacitor is coupled to a first data line of a tracking cell of the tracking circuit. A first transition of a signal of the first data line causes a first transition of a signal of a second data line of the memory cell.

In some embodiments, a tracking circuit comprises a first circuit, a first tracking cell, a first data line, a second data line, and a capacitive device. The first data line is coupled to the first circuit and the first tracking cell. The second data line is coupled to the first circuit. A capacitive device is coupled to the first data line. The capacitive device is configured to have a capacitance that causes a predetermined time delay in a signal transition of the first data line. The signal transition of the first data line is configured to generate a signal transition of the second data line. The signal transition of the second data line is configured to generate a signal transition of a memory cell.

In some embodiments, a first transition of a signal of a first data line of a tracking cell coupled to a second data line of a tracking circuit is generated. A first transition of a signal of the second data line is generated based on the first transition of the signal of the first data line. A first transition of a signal of a third data line is generated based on the first transition of the signal of the second data line and a first circuit configured to receive the second data line and provide the third data line. A first transition of a signal of a fourth data line used in accessing a memory cell is generated. The signal of the second data line is affected by a capacitive load of at least one capacitor selected from a group consisting of a conductive line capacitor, a metal-oxide-silicon capacitor, a diffusion capacitor, and a poly capacitor.

The above methods show exemplary steps, but the steps are not necessarily performed in the order shown. Steps may be added, replaced, changed order, and/or eliminated as appropriate, in accordance with the spirit and scope of disclosed embodiments.

What is claimed is:

1. A method comprising:
   determining a time delay to cover a timing of a memory cell in a memory macro having a tracking circuit;
   based on the time delay, determining a capacitance corresponding to the time delay; and
   utilizing a capacitor having the determined capacitance, wherein
   the determined capacitance of the capacitor affects a transition of a signal of a first data line of a tracking cell of the tracking circuit; and
   the transition of the signal of the of the first data line causes a first transition of a signal of a second data line of the memory cell.

2. The method of claim 1, wherein
determining the time delay is based on a plurality of current values of currents sunk by a corresponding plurality of memory cells of the memory macro.

3. The method of claim 2, wherein
determining the time delay is based on a one-sigma, a two-sigma, a three-sigma, a four-sigma, a five sigma, or a six-sigma value of the plurality of current values.

4. The method of claim 1, wherein
the capacitor is selected from a group consisting of a pair of conductive lines, a metal-oxide semiconductor capacitor, a diffusion capacitor, and a poly capacitor.

5. The method of claim 4, wherein
a conductive line of the pair of conductive lines is selected from a group consisting of a first conductive line, a reference voltage conductive line, and an operational voltage conductive line.

6. The method of claim 4, wherein
a conductive line of the pair of conductive lines is from an interface cell area between a memory circuit area and a logic circuit area of the memory macro.

7. The method of claim 1, wherein the capacitor is formed by a metal-oxide semiconductor transistor manufactured by a memory process or a logic process.

8. The method of claim 1, wherein
a first transition of a clock signal causes a first transition of a signal of a third data line;
the first transition of the signal of the third data line causes the first transition of the signal of the first data line;
the first transition of the signal of the first data line causes a second transition of the signal of the third data line;
the second transition of the signal of the third data line causes the first transition of the signal of the second data line; and
the first transition of the clock signal causes a second transition of the signal of the second data line.

9. The method of claim 8, wherein
the first transition of the clock signal is rising;
the first transition of the signal of the third data line is rising;
the first transition of the signal of the first data line is falling;
the second transition of the signal of the third data line is falling;
the first transition of the signal of the second data line is rising; and
the second transition of the signal of the second data line is falling.

10. A tracking circuit comprising:
a first circuit;
a first tracking cell;
a first data line coupled to the first circuit and the first tracking cell;
a second data line coupled to the first circuit; and
a capacitive device coupled to the first data line,
wherein
   the capacitive device is configured to have a capacitance that causes a predetermined time delay in a signal transition of the first data line,
   the signal transition of the first data line is configured to generate a signal transition of the second data line, and
   the signal transition of the second data line is configured to generate a signal transition of a memory cell.

11. The tracking circuit of claim 10, wherein
the capacitive device is selected from a group consisting of a pair of conductive lines, a metal-oxide semiconductor capacitor, a diffusion capacitor, and a poly capacitor.

12. The tracking circuit of claim 11, wherein
a conductive line of the pair of conductive lines is selected from the group consisting of a first conductive line, a reference voltage line, and an operational voltage line.

13. The tracking circuit of claim 11, wherein a conductive line of the pair of conductive lines is from an interface cell area located between a memory cell area and a logic cell area of a memory macro having the tracking circuit.

14. The tracking circuit of claim 10, wherein
the capacitive device includes a first capacitor and a second capacitor; and
the first capacitor is formed by a first conductive line and a first reference voltage line, and the second capacitor is formed by the first conductive line and a second reference voltage line; or
the first capacitor is formed by a second conductive line and a first operational voltage line, and the second capacitor is formed by the second conductive line and a second operational voltage line; or
the first capacitor is formed by a third conductive line and a third reference voltage line, and the second capacitor is formed by the third conductive line and a third operational voltage line.

15. The tracking circuit of claim 10, further comprising at least one third data line coupled to the first data line, each of a data line of the at least one third data line coupled to a corresponding tracking cell.

16. A method comprising:
generating a first transition of a signal of a first data line of a tracking cell coupled to a second data line of a tracking circuit;
generating a first transition of a signal of the second data line based on the first transition of the signal of the first data line;
generating a first transition of a signal of a third data line based on the first transition of the signal of the second data line and a first circuit configured to receive the second data line and provide the third data line; and
generating a first transition of a signal of a fourth data line used in accessing a memory cell,
wherein
the signal of the second data line is affected by a capacitive load of at least one capacitor selected from the group consisting of a conductive line capacitor, a metal-oxide semiconductor capacitor, a diffusion capacitor, and a poly capacitor.

17. The method of claim 16, wherein
the conductive line capacitor includes a pair of conductive lines, a conductive line of the pair of conductive lines is selected from a group consisting of a first conductive line, a reference voltage line, and an operational voltage line.

18. The method of claim 16, wherein
the conductive line capacitor includes a pair of conductive lines, a conductive line of the pair of conductive lines is from an interface cell area located between a memory cell area and a logic circuit area of a memory macro having the tracking circuit.

19. The method of claim 16, wherein
the at least one capacitor includes a first conductive line capacitor and a second conductive line capacitor;
the first conductive line capacitor is formed by a first conductive line and a first reference voltage line, and the second conductive line capacitor is formed by the first conductive line and a second reference voltage line; or
the first conductive line capacitor is formed by a second conductive line and a first operational voltage line, and the second conductive line capacitor is formed by the second conductive line and a second operational voltage line; or
the first conductive line capacitor is formed by a third conductive line and a third reference voltage line, and the second conductive line capacitor is formed by the third conductive line and a third operational voltage line.

20. The method of claim 16, wherein the metal-oxide semiconductor capacitor is manufactured by either a memory process or a logic process.

* * * * *